United States Patent [19]

Erb

[11] 4,158,238

[45] Jun. 12, 1979

[54] STRATIFIED CHARGE RAM HAVING AN OPPOSITE DOPANT POLARITY MOSFET SWITCHING CIRCUIT

[76] Inventor: Darrell M. Erb, 1100 Runnymead, Los Altos, Calif. 94022

[21] Appl. No.: 898,910

[22] Filed: Apr. 21, 1978

[51] Int. Cl.$^2$ ............................................. G11C 11/40
[52] U.S. Cl. ..................................... 365/182; 365/185; 357/23; 357/63
[58] Field of Search ............... 365/174, 178, 182, 184, 365/185; 357/23, 24, 63

[56] References Cited

U.S. PATENT DOCUMENTS 3,996,657   12/1976   Simko et al. ........................ 365/185

*Primary Examiner*—Terrell W. Fears
*Attorney, Agent, or Firm*—Paul Hentzel

[57] ABSTRACT

A P-channel MOS stratified charge memory is formed on an N tub and controlled by peripheral N-channel MOS switches formed in the surrounding P substrate. A positive bias (+5 volts) applied to the N tub and a negative bias (−5 volts) applied to the P substrate create an isolation reverse bias therebetween. During the write mode, the row electrode of the addressed memory cell receives a positive control signal (+5 volts, zero with respect to the N tub) to establish accumulation for supporting electron conduction in the active channel under the row electrode. During the storage mode each row receives a less positive control signal (0 volts, minus five volts with respect to the N tub) to establish a depletion in the active channel thereunder which is nonconductive to both holes and electrons. During the read mode, the row of the addressed memory cell receives an even less positive control signal (−5 volts, minus ten volts with respect to the N tub) to establish inversion for supporting hole conduction in the active channel thereunder. The N dopant differential between the N+ doped row lead and the N doped active channel creates a work function slightly favorable towards electron accumulation during writing. In addition, the fixed positive surface charge (Qss) formed in the overlying gate oxide contributes toward electron accumulation. During the write mode when the row to tub voltage is zero, these two pro electron accumulation effects attract sufficient electrons from the N tub into the active channel to support the charging current into the memory storage region.

23 Claims, 7 Drawing Figures

STRATIFIED CHARGE RAM HAVING AN OPPOSITE DOPANT POLARITY MOSFET SWITCHING CIRCUIT

FIELD OF THE INVENTION

This invention relates to random access memories, and more particularly to random access memories having memory cell arrays on substrates of one dopant polarity and switching circuits on substrates of the other dopant polarity.

DESCRIPTION OF THE PRIOR ART

Heretofore, RAMs have employed a common substrate for both the memory cell array and the peripheral switching circuit. P substrates were favored because they offered the faster operating N-channel MOS circuits. Tubs on oppositely doped substrates were limited primarily to complimentary MOS (C-MOS) applications. The OFF condition these MOS circuits was maintained by a depletion region, and the ON condition was maintained by an inversion region which supported minority carrier conduction. Majority carrier conduction across an accumulation region was normally not employed as the ON condition. When accumulation majority carrier conduction was employed, the accumulation was conventionally established by generating an electric field through externally applied voltages, and not by internal edge effects.

SUMMARY OF THE INVENTION

It is therefore an object of this invention to provide a RAM with memory cells on a substrate of opposite dopant polarity from the substrate of the peripheral switching circuitry.

It is another object of this invention to provide a RAM with fast operating peripheral MOS circuits.

It is another object of this invention to provide a RAM with stratified charge memory cells employing accumulation to establish an ON condition for conducting majority carriers.

It is another object of this invention to provide a RAM having a memory array which is electrically isolated from the switching circuits.

It is another object of this invention to provide a RAM which is operable with a minimum of power supply voltage levels.

It is another object of this invention to provide a RAM with stratified charge memory cells employing enhanced accumulation to establish an ON conductive condition.

It is another object of this invention to provide a RAM with stratified charge memory cells employing internal edge effects for biasing the active channel towards accumulation.

It is another object of this invention to provide an SCM RAM which is compatible with conventional power supplies and with conventional supply voltage levels such as plus 5 and 0 and minus 5 or such as plus 5 and 0 and minus 5 and plus or minus 12.

BRIEF DESCRIPTION OF THE DRAWINGS

Further objects and advantages of the present invention and the relationship between the switching circuit and the memory array will become apparent to those skilled in the art from the following detailed description taken in conjunction with the drawings in which.

DETAILED DESCRIPTION OF THE PREFERRED EMBODIMENTS

General Embodiment

Figure 1:
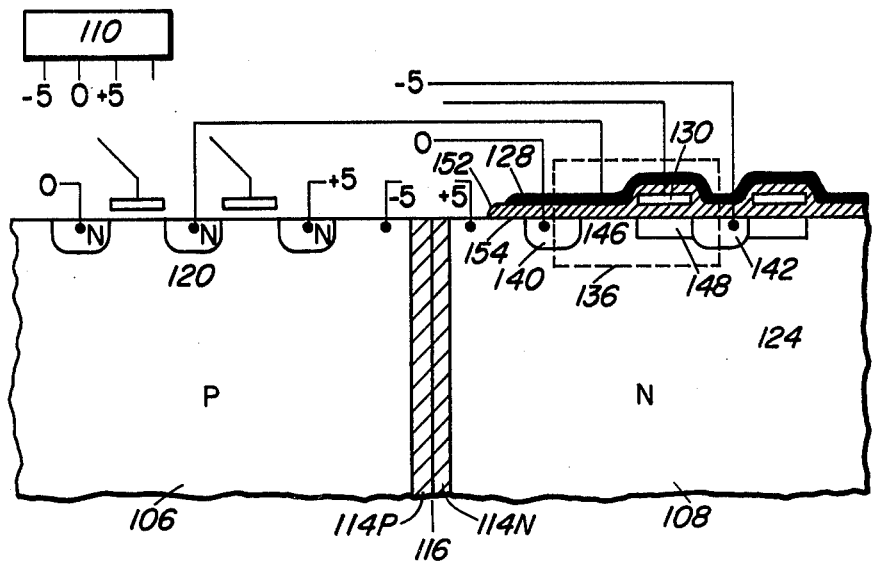
FIG. 1 is a fragmentary elevation view in section showing a semiconductor substrate with a stratified charge memory (SCM) controlled by an N-channel MOS switching circuit.

FIG. 1 shows a semiconductor wafer 100 with circuit area 106 of one dopant polarity (such as P) and a memory area 108 of the opposite dopant polarity (such as N). Power supply 110 maintains reverse biased depletion regions 114N and 114P between circuit area 106 and memory area 108 along interface 116 by applying a supply voltage of one polarity (such as plus 5 volts) to memory area 108 and a supply voltage of the opposite polarity (such as minus 5 volts) to circuit area 106. The minus 5 volts applied to circuit area 106 also establishes the required reverse bias within each N-channel switch 120 formed therein permitting each switch to decode all of the more positive supply voltages for addressing and activating the P-channel memory cell array 124 formed in memory area 108. Only a portion of switches 120 and memory cell area 124 are shown for illustrative convenience. The plus 5 volts applied to memory area 108 establishes the required reverse bias with source 140 (activated by the zero supply voltage) and drain 142 (activated by the minus 5 supply voltage).

SCM Operation

Memory cell array 124 is a stratified charge memory (SCM) of the type shown and described in detail the "Digest of the 1978 ISSCC Conference" (pages 24 and 25) and in U.S. patent application SN 866541, entitled "A Memory Device in Which One Type Carrier Stored During Write Controls the Flow of the Other Type Carrier During Read" filed on Jan. 3, 1978 by Darrell M. Erb. Writing is accomplished within cell array 124 by applying an accumulation control signal (the plus 5 volt supply voltage) to the selected row lead (i.e., row lead 128) while simultaneously applying the data in signal to the selected column lead (i.e., column lead 130). Memory cell 136 at the intersection of the selected row 128 and selected column 130 is both addressed and provided with input by the application of these two control signals. Cell 136 is formed by source 140 and drain 142 with an active channel therebetween containing row gate zone 146 and column gate zone 148. The plus 5 volt accumulation signal applied to row lead 128 permits electrons from the adjacent N substrate (which is also at plus 5 volts) to enter row gate zone 146. If a write "1" data in signal is applied to column lead 130, the accumulation electrons enter a memory charge pocket in the upper portion of column gate zone 148. The application of a less positive write "0" data in signal to column lead 130 prevents the accumulated electrons from entering the memory charge pocket. Storage is accomplished by applying a depletion control signal (the zero supply voltage) to row lead 128. The zero supply voltage is at minus 5 volts with respect to the N substrate (memory area 108) causing an electron depletion throughout row gate zone 146. Row gate zone 146 will not support conduction during storage and charge flow into or out of the memory charge pocket is prevented. Reading is accomplished by applying an inversion control signal (minus 5 volts) to the selected row lead while simultaneously applying a read control signal to the selected column electrode. The inversion control signal permits holes from source element 140 to conduct across row gate zone 146. The read control signal lowers the energy profile across column gate 148 sufficiently to allow hole conduction when combined with a "1" electron charge in the memory charge pocket (read "1"). The "0" electron charge does not adequately supplement the read control signal and hole conduction is prevented (read "0"). Further details concerning operation of SCM array 124, the storage pocket shielding techniques, and the method of making an SCM device are provided in patent application Ser. No. 866,541 noted hereinbefore.

Accumulation Enhancement

Figure 2A:
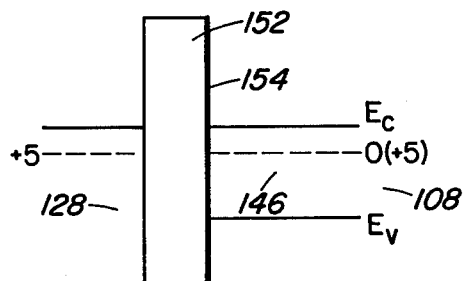
FIG. 2 A-D is an electron energy diagram across the row gate showing the accumulation status without the enhancement effects.
FIG. 2B is an electron energy diagram showing the accumulation effect of reducing the work function differential between the N+row lead and the N substrate.
FIG. 2C is an electron energy diagram showing the accumulation effect of the fixed positive charge (Qss) along the bottom of the gate oxide.
FIG. 2D is an electron energy diagram showing the accumulation status produced by combining the reduce work function effect of FIG. 2B with the fixed positive charge (Qss) effect of FIG. 2C.

During writing, row lead 128 and N substrate 108 are at the same potential (plus 5 volts) and conduction electrons from substrate 108 distribute themselves throughout row gate zone 146. Row gate zone 146 must be sufficiently conductive during writing to supply the required electron charge to the memory charge pocket. The same accumulation situation exists within column gate zone 148 during write "1." Column lead 130 is at plus 5 volts and the electron accumulation within row gate zone 146 extends into column gate zone 148. Two effects are present which enhance the accumulation state of row gate zone 146 during writing—reduced work function and fixed surface charge (Qss). FIG. 2A shows the electron energy diagram between row lead 128 and row gate zone 146 across gate silicon oxide 152 without either the reduced work function effect (shown separately in FIG. 2B) or the fixed surface charge (Qss) effect (shown separately in FIG. 2C). FIG. 2D shows the combined additive band bending impact 256T of both effects and the resulting enhanced accumulation of electrons at the oxide-silicon interface 154. Prior art devices established electron accumulation by applying a small positive supply voltage such as plus 2 volts, which complicates the power supply. The above enhancement techniques provide the required accumulation without requiring a special supply voltage.

Figure 2B:
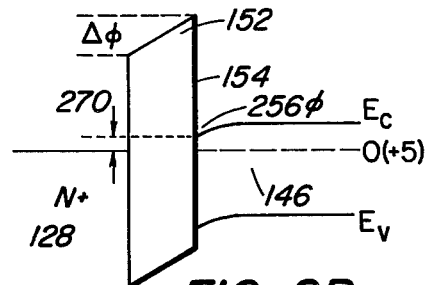

Reduced Work Function Effect—FIG. 2B

The difference in work function (delta $\phi$) between row lead 128 and substrate 108 has a pro-accumulation effect within row gate zone 146. FIG. 2B shows an N+ doped row lead 128 in which the fermi level is at the conduction electron voltage Ec a degenerate dopant condition. The heavily donor concentration causes row lead 128 to have a lower work function producing band bending 256$\phi$ in row gate zone 146 near gate oxide 152.

A portion of delta $\phi$ is lost across gate insulation 152 (as shown at 270). This loss can be minimized by employing a thin insulative layer 152 formed of highly dielectric material.

Figure 2C:
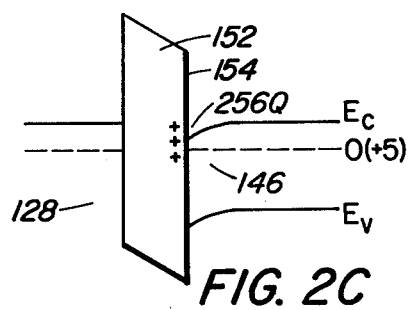
Figure 2D:
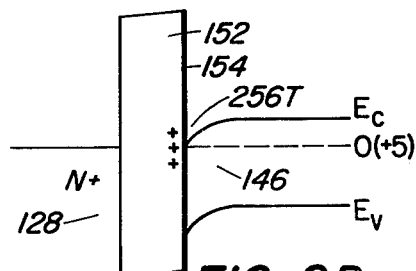

Fixed Surface Charge (Qss)—FIG. 2C

During the process of forming silicon oxide layer 152 on the surface of N substrate 108, edge effects (such as lattice and valence mismatch) cause dangling positive bonds within oxide layer 152 primarily along interface 154. This fixed positive surface charge extends over the entire lower surface of silicon oxide layer 152 and creates a small electric field across row gate zone 146 in favor of accumulation. At all times throughout the operation of memory cell 136 there is a small but constant bias on the substrate conduction electrons urging them toward interface 154. During writing, when both row lead 138 and N substrate 108 are at plus 5 volts, this bias towards electron accumulation significantly increases the conductivity of row gate zone 146. As can be seen in FIG. 2C, the fixed positive charge has the effect of lowering interface 154 creating the accumulation dip 256Q. The small static force generated by the positive surface charge creates a slight opposition to depletion and inversion required for storage and reading. However, the surface charge force is easily overwhelmed by the relatively large voltage differences between row lead 128 and substrate 108 present during storage (minus 5 volts) and reading (minus 10 volts). The fixed charge has a significant effect only when the voltage across gate oxide 152 is very small or zero.

Many dielectric materials exhibit the fixed surface charge effect, and may be employed as gate insulation 152. However, silicon oxide and silicon nitride are preferred because they are the conventional gate oxide insulator used in the MOS technology. Of the two, silicon nitride generates more fixed charge. The amount of fixed charge may also be increased by forming the gate insulation on the [111] crystalline plane of silicon substrate 108.

Bulk Storage Embodiment

Figure 3:
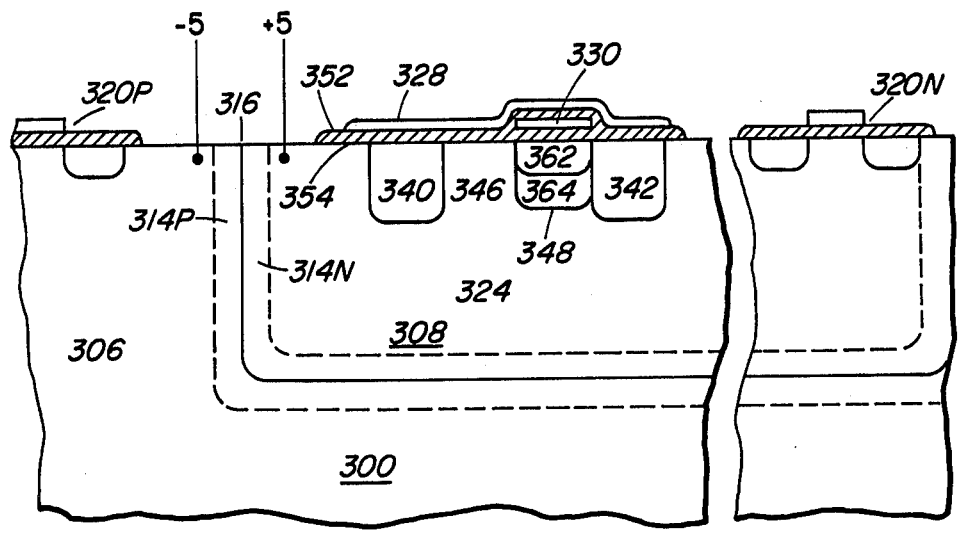
FIG. 3 is a fragmentary elevation view in section of a bulk storage SCM embodiment on an N-tub.

FIG. 3 shows a bulk storage embodiment 300 of the SCM in which memory array 324 is formed in N tub 308 on P substrate 306. Row gate zone 346 has the same write mode accumulation, storage mode depletion, and read mode inversion as described in the FIG. 1 embodiment. Enhanced accumulation is similarly established by the Qss charge along interface 354 between silicon oxide layer 352 and row lead 328 and the work function lowering effect of the N+ dopant in row lead 328. Column gate zone 348 of bulk storage embodiment 300 is formed under column gate lead 330 by memory charge pocket (N storage volume 362) and memory conductive P region 364. Only three voltage levels are required to operate bulk storage embodiment 300—an intermediate voltage, a positive voltage with respect thereto and a negative voltage with respect thereto. In a P-channel SCM, the difference between the intermediate voltage and the positive voltage must be sufficient to establish depletion during the storage mode and write "0" mode. The difference between the positive voltage and the negative voltage must be sufficient to establish inversion during the read mode. Table I below shows the voltage schedule for +5, O and −5 supply voltages.

TABLE I

Supply Voltage Distribution for P-Channel
Bulk Storage SCM with Three Levels of Supply Voltage

| | Write | Storage | Read |
|---|---|---|---|
| Tub 308 | +5 | | |
| Source 340 | 0 | | |
| Drain 342 | −5 | | |
| Row 328 | +5 | 0 | −5 |
| Column 330 | 0 (W"0") +5 (W"1") | +5 P | 0 P |

During the write "1" mode N storage volume 362 acquires an electron charge from N tub 308 from the electron accumulation in row gate zone 346 in response to a write "1" data in signal (plus 5 volts) on column lead 330. The enhanced electron accumulation extends into storage volume 362 and the electrons become trapped therein when the accumulation control signal (plus 5 volts) on row lead 328 is replaced by the depletion control signal (zero volts) at the start of the storage mode. During the write "0" mode the accumulation electrons are prevented from entering N storage volume 362 due to the write "0" data in signal (zero volts) on column lead 330. During read, the inversion region generated under row electrode 328 connects with memory conductive P region 364 to conduct holes from source 340 to drain 342 if a "1" electron charge is in N memory pocket 362.

FIG. 3 also shows a low power C-MOS type switching circuit having N-channel MOS switches 320 P on P substrate 306 and P-channel MOS switches 320 N on N tub 308 along with memory array 324.

An advantage of the N tub bulk storage embodiment is the ease with which N storage volume 362 and buried P region 364 may be formed in a single diffusion step. Slow diffusing arsenic is employed for the N dopant and faster diffusing boron is employed for the P dopant. Arsenic and boron are implanted and then diffused simultaneously to form buried P region.

Method of Manufacture of Bulk Storage SCM

The process sequence for an N substrate memory array with a P tub switching area is as follows:

Step 1. Provide an N type (100) oriented substrate wafer of about $5 \times 10^{14}$ cm$^{-3}$ carrier concentration. This resistivity is governed by the switching MOS circuit requirements. It is expected that the MOS circuitry will use a threshold tailoring implant to make the enhancement mode transistors.

Step 2. Grow a 5000 Å thick masking oxide.

Step 3. Mask and etch open the P tub areas that will contain the switching MOS circuitry.

Step 4. Implant boron for the P tub.

Step 5. Oxidize and drive the boron implant into the P tub. The junction should be about 5 micrometers deep. The implant dose should be designed to give a surface P concentration of about $2 \times 10^{15}$ cm$^{-3}$.

Step 6. Strip all the oxide. The oxidation done in step 5 will imprint the first mask pattern in the silicon.

Step 7. Grow the thin pad oxide 500 to 1000 Å thick.

Step 8. Deposit silicon nitride—1500 Å.

Step 9. Mask the nitride leaving nitride over all channel and junction areas.

Option: It may be desirable to make the SCM with a recessed isoplanar process in which some silicon is etched away at this time.

Step 10. Mask the SCM areas exposing the switching MOS tub.

Step 11. Field dope implant the N-MOS fields in the P tub with boron. The region between the SCM channels is $5 \times 10^{14}$ cm$^{-3}$ n-type. With Qss being positive and the voltage being relatively low, it should not be necessary to do an N-type field implant. If one is necessary, then a light phosphorous implant would be included here with an additional masking step.

Step 12. Oxidize the field regions in which about 1 micrometer of thermal oxide is grown.

Step 13. Strip nitride and the thermal oxide beneath the nitride.

Step 14. Grow the first gate oxide 700 Å thick. If nitride is to be used for higher capacitance, then grow 100–150 Å of oxide and deposit 550–600 Å of nitride instead.

Step 15. Implant boron for the P type region beneath the column electrodes. The implant should be as shallow as possible.

Step 16. Implant arsenic (if the bulk storage SCM device is being made).

Step 17. Deposit and dope N+ the poly silicon for the column electrodes.

Step 18. Mask the column electrodes. The poly silicon is removed from all the switching MOS areas.

Step 19. Mask opening up just the SCM source-drain areas for all the drain busses. This mask has edges down the middle of the column electrodes and the column electrodes define the drain bus. For the 6F$^2$ and 8F$^2$ SCM cells, the alignment of this mask is important for the location of the source bus. With the mask in place, etch the thermal field oxide from the exposed field areas.

Step 20. Boron implant the P+ source and drain busses with the mask of step 19 in place.

Step 21. Deposit undoped oxide 5000 Å thick. This oxide is used to reduce the drain bus capacitance and to cover up the exposed P+ areas during the later N+ diffusion.

Step 22. Mask and etch away the deposited and thermal oxide in the N+ junction area, the N-MOS channel areas and the surface channel areas for the SCM cell. This mask will have edges down the middle of the column electrodes.

Step 23. Remove a shallow layer of the exposed silicon which contains the boron and arsenic of steps 15 and 16. This step can be done with a controlled plazma etch, a very low temperature thermal oxidation or an anodic oxidation. It is preferred to minimize the process drive from steps 17 through 22 so that the boron remains in a very shallow layer.

Step 24. Oxidize for the second gate oxide (700 Å).

Step 25. Deposit and dope N+ the second layer of poly silicon which will become half of the row electrodes. This is a good place to drive the boron implant beneath the column electrode. The arsenic with its smaller diffusion coefficient, will stay shallow with respect to the boron.

Step 26. Mask and etch the second layer of poly silicon.

Step 27. Dip etch the oxposed second gate oxide away. The oxide over the P+ junction areas is thick enough to withstand this etch.

Step 28. Oxidize for the third gate oxide.

Step 29. Implant mask exposing switching MOS areas.

Step 30. Boron implant for threshold tailoring the switching MOS transistors.

Step 31. Deposit the third layer of poly silicon.

Step 32. Mask and etch the third layer of poly silicon.

Step 33. Dip etch to expose the N+ switching MOS junction areas. The oxide over the P+ areas is still thick enough so that the P+ areas are not exposed.

Step 34. Dope the N+ junctions and the third level of poly with phosphorous or arsenic.

Note: The remaining steps are well established silicon gate processing steps that will vary slightly between different manufacturers.

Step 35. Phosphorous doped vapox deposition.
Step 36. Gathering and flow.
Step 37. Contact mask to all levels of poly, N+ and P+ junctions.
Step 38. Reflow.
Step 39. Aluminum evaporation.
Step 40. Metal mask.
Step 41. Passivation dielectric deposit.
Step 42. Pad mask.

The process given in steps 15-23 may be modified. To remove the boron doped layer in the surface channel areas of the switching MOS and the row electrodes. In the following substitute process Steps A-15 through A-23-3 the boron and compensating phosphorous implants are preferrably confined to the SCM areas with implant masks. The process begins after step 14.

Step A15-1 Implant mask leaving the SCM areas exposed.
A15-2 Implant boron.
Step A15 Implant arsenic (if the bulk storage SCM device is being made).
Step A16 No step
Step A17 Deposit and dope N+ the poly silicon for the column electrodes.
Step A18 Mask the column electrodes. The poly silicon is removed from all the switching MOS areas.
Step A19 Mask exposing the P+ source-drain busses (see Step 19 of the main process).
Step A20 Boron implant or predope the P+ source and drain busses.
Step A21 Deposit undoped oxide as in step 21 of the main process.
Step A22 Mask and etch away the deposited oxide as in step 22 of the main process.
Step A23-1 Remove the shallow layer of exposed silicon that contains the arsenic implant of step 3. This is done with a low temperature oxidation, a silicon etch or an anodic oxidation.
Step A23-2 Implant mask exposing the SCM areas only.
Step A23-3 Implant phosphorous to compensate the boron of Step 2 in the surface channel areas beneath the row electrodes. The energy, dose and drives of the boron and phosphorous profiles should be such that the boron implant is just compensated by the phosphorous.

Continue with the main process at step 24.

Inversion Layer Storage Embodiment

Figure 4:
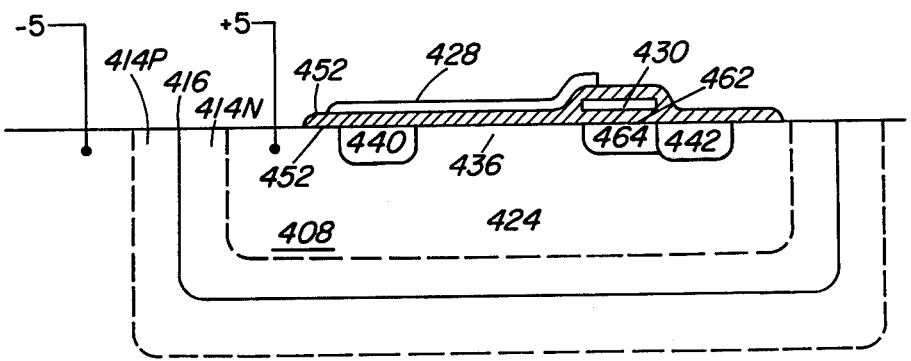
FIG. 4 is a fragmentary elevation view in section of inversion layer SCM embodiment on an N-tub.

FIG. 4 shows an inversion layer storage embodiment 400 of the SCM in which the memory charge pocket is an inversion layer 462 under column electrode 430 between gate oxide 452 and P conductive region 464. Memory cell array 424 for inversion layer embodiment 400 is formed in N tub 408 on P substrate 406 and employ the SCM operation and accumulation enhancement effect described in connection with FIG. 1; but requires four levels of control signals—an intermediate voltage, a first positive voltage, a second more positive voltage, and a negative voltage with respect to the intermediate voltage. In a P-channel SCM, the difference between the first positive voltage and the intermediate voltage must be sufficient to establish depletion as described in connection with the bulk storage embodiment 300. Likewise, the difference between the first positive voltage and the negative voltage must be sufficient to cause inversion. Table II below shows the voltage schedule for +12, +5, 0, and −5 supply voltages.

TABLE II

Supply Voltage Distribution for a P-Channel Inversion Storage SCM with Four Levels of Supply Voltage

|  | Write | Storage | Read |
|---|---|---|---|
| Substrate 408 | +5 | | |
| Source | 0 | | |
| Drain | −5 | | |
| Row | +5 | 0 | −5 |
| Column | +5(W"0") +12(W"1") | +12 or +5 | +5 |

CONCLUSION

It will be apparent to those skilled in the art that the objects of this invention have been achieved by providing a reversed biased tub in a substrate which isolates the switching noise from the SCM array. The switching circuits are fast N-channel MOS and are formed on a P substrate or a P tub. The disclosed accumulation enhancement techniques eliminate one voltage level requirement. An externally applied voltage difference is no longer required to establish accumulation; and the current SCM device accomodates conventional three level power supplied (bulk storage embodiment of FIG. 3) and four level power supplies (inversion layer storage of FIG. 4).

Additional changes and modifications may be made in the disclosed embodiments without departing from the scope of the invention. Therefore, the scope of the invention is to be determined by the terminology of the following claims and the legal equivalents thereof.

I claim as my invention:

1. A random access memory addressed and energized into a write mode and a storage mode and a read mode by a plurality of supply voltages including an intermediate supply voltage and at least one supply voltage of one polarity with respect to the intermediate supply voltage and one supply voltage of the opposite polarity with respect to the intermediate supply voltage, the memory comprising:

a semiconductor substrate having a circuit area at least part of which is one dopant polarity and having a memory area of the opposite dopant polarity, the supply voltage of opposite polarity being applied to the circuit area and a supply voltage of the one polarity being applied to the memory area for establishing a reverse bias potential across the P-N junction formed along the interface between the circuit area of the one dopant polarity and the memory area of the opposite dopant polarity;

a plurality of opposite dopant polarity channel MOS switches formed in the circuit area of the semiconductor substrate for switching supply voltages of both polarities, the opposite dopant polarity elements of the switches being reversed biased with respect to the circuit area of the one dopant polarity by the supply voltage of the opposite polarity applied to the circuit area;

a row by column memory array having a plurality of memory cells with row and column gates formed in the memory area of the semiconductive substrate, and having row and column conductive leads extending to the plurality of switches, and addressed by the supply voltages as switched onto the row and column conductive leads by the plurality of switches for establishing the write mode and storage mode and read mode in the memory cells, each individual memory cell including;

a source element of the one dopant polarity;

a drain element of the one dopant polarity spaced from the source element;

active channel formed by that portion of the other area of the semiconductive substrate between the source element and the drain element for conducting carriers of the opposite polarity during the write mode and for conducting carriers of the one polarity during the read mode;

a gate insulator formed over the active channel;

a row gate zone formed in the active channel between the source element and the drain element;

a row gate electrode formed on the gate insulator over the row gate zone;

the row gate zone responsive to the supply voltage of the one polarity for supporting conduction of the carriers of the opposite polarity during the write mode, depletion responsive to the intermediate supply voltage for inhibiting conduction of carrier of both polarities during the storage mode, and inversion responsive to a supply voltage of the opposite polarity for supporting conduction of the carriers of the one polarity during the read mode;

a column gate zone formed in the active channel between the source element and the drain element by a memory charge pocket proximate the gate insulator and a memory conductive region formed proximate the memory charge pocket; and a column gate electrode formed on the gate insulator over the column gate zone.

2. The random access memory of claim 1, wherein the row conductive lead is of the opposite dopant polarity to a greater extent than the memory area for causing the row gate electrode to have a different work function than the row gate zone to create an accumulation favorable environment in the row gate zone during the writing mode.

3. The random access memory of claim 2 wherein the one dopant polarity is P and the opposite dopant polarity is N, and the one polarity supply voltage is plus and the opposite polarity supply voltage is minus.

4. The random access memory of claim 3, wherein the row gate electrode is heavily N doped for reducing the work function thereof.

5. The random access memory of claim 4, wherein:
the circuit area of the semiconductor substrate is P and the plurality of switches thereon are N-channel MOS, and the memory area is an N tub formed within the P substrate, and the interface therebetween is reversed biased.

6. The random access memory of claim 4, wherein the memory area of the semiconductor substrate is N, and the circuit area is a P tub on the N substrate and the plurality of switches in the circuit area are N-channel MOS.

7. The random access memory of claim 4, wherein the gate insulation has a positive charge therein which creates an environment favorable to electron accumulation in the active channel.

8. The random access memory of claim 7, wherein the positive charge a fixed Qss charge.

9. The random access memory of claim 8, wherein the gate insulation is silicon oxide.

10. The random access memory of claim 8, wherein the gate insulation is silicon nitride.

11. The random access memory of claim 8, wherein the semiconductor substrate is crystalline silicon and the gate insulation is formed on the [111] crystalline plane of the silicon substrate.

12. The random access memory of claim 4, wherein the plurality switches and the memory array are operable with three supply voltages.

13. The random access memory of claim 12, wherein the three supply voltages are an intermediate supply voltage and one positive supply voltage with respect to the intermediate supply voltage and one negative supply voltage with respect to the intermediate supply voltage.

14. The random access memory of claim 13, wherein the memory charge pocket is an N dopant surface region under the column electrode and the memory conductive region is a P dopant region thereunder.

15. The random access memory of claim 14, wherein the memory conductive P region is formed by compensation doping of the N memory area with a P dopant.

16. The random access memory of claim 15, wherein the N memory charge pocket is formed by compensation of a portion of the memory conductive P region with an N dopant.

17. The random access memory of claim 16, wherein the memory conductive P region and the N memory charge pocket are formed by double diffusion using a slow N dopant to form the N memory charge pocket and a faster P dopant to form the memory conductive P region.

18. The random access memory of claim 17, wherein the slow diffusion N dopant is arsenic and the faster diffucion P dopant is boron.

19. The random access memory of claim 13, wherein the thru supply voltage levels are plus 5 volts and zero volts and minus 5 volts.

20. The random access memory of claim 4, wherein the plurality of switches and the memory array are operable with four supply voltages.

21. The random access memory of claim 20, wherein the four supply voltages are an intermediate supply voltage and a lower and a higher positive supply voltage with respect to the intermediate voltage and one negative supply voltage with respect to the intermediate supply voltage.

22. The random access memory of claim 21, wherein the memory charge pocket is an N inversion layer formed proximate the gate insulation by at least one of the positive supply voltages.

23. The random access memory of claim 22, wherein the four supply voltages are plus 12 volts and plus 5 volts and zero volts and minus 5 volts.

* * * * *